(12) United States Patent
Kim et al.

(10) Patent No.: US 12,740,367 B2
(45) **Date of Patent: *Sep. 15, 2026**

(54) POSITION DETERMINATION APPARATUS FOR ROBOT DETECTION LASER SENSOR SYSTEM IN FOUP MOVABLE BY OHT

(71) Applicants: Kyu Ok Lee, Seongnam-si (KR); SAMSUNG ELECTRONICS CO., LTD., Suwon-si (KR)

(72) Inventors: Ji Yong Kim, Hwaseong-si (KR); Kyu Ok Lee, Seongnam-si (KR)

(73) Assignees: Kyu Ok Lee, Seongnam-si (KR); SAMSUNG ELECTRONICS CO., LTD., Suwon-si (KR)

( * ) Notice: Subject to any disclaimer, the term of this patent is extended or adjusted under 35 U.S.C. 154(b) by 575 days.

This patent is subject to a terminal disclaimer.

(21) Appl. No.: 18/200,201

(22) Filed: May 22, 2023

(65) Prior Publication Data

US 2024/0282607 A1 Aug. 22, 2024

(30) Foreign Application Priority Data

Feb. 20, 2023 (KR) ........................ 10-2023-0022014

(51) Int. Cl.
*H10P 72/00* (2026.01)
*H10P 72/30* (2026.01)
*H10P 72/50* (2026.01)

(52) U.S. Cl.
CPC .......... *H10P 72/0606* (2026.01); *H10P 72/30* (2026.01); *H10P 72/3411* (2026.01); *H10P 72/53* (2026.01)

(58) Field of Classification Search
CPC ................. B25J 11/0095; B25J 13/089; H01L 21/67259; H01L 21/677; H01L 21/67763;
(Continued)

(56) References Cited

U.S. PATENT DOCUMENTS 6,900,877 B2 5/2005 Raaijmakers
8,041,450 B2 10/2011 Takizawa et al.
(Continued)

FOREIGN PATENT DOCUMENTS

JP 2012-189768 A 10/2012
JP 2014-143388 A 8/2014
(Continued)

*Primary Examiner* — Jacob S. Scott
*Assistant Examiner* — Temesgen M. Maru
(74) *Attorney, Agent, or Firm* — Quantum Patent Law Firm; Seongyoune Kang

(57) ABSTRACT

The present invention relates to a position determination apparatus for a robot detection laser sensor system in front-opening unified pods (FOUPs), including: an external server; and a wafer processing device for performing processing for wafers and transmitting integration management data to the external server, wherein the wafer processing device may include: the FOUPs configured to accommodate the wafers therein; loadports to which the FOUPs are detachably coupled; processing chambers in which the processing for the wafers are performed; and an equipment front end module (EFEM) disposed between the processing chambers and the loadports and having an end-effector adapted to get the wafers out of the FOUPs into the processing chambers or put the wafers finished in processing in the processing chambers into the FOUPs.

3 Claims, 15 Drawing Sheets

(58) Field of Classification Search
CPC ............. H01L 21/67778; H01L 21/681; H01L 21/67265; H01L 21/67769; H01L 21/67155; H01L 21/67739; H01L 21/67775; H01L 21/67167; H01L 21/6735; G01B 11/043; G01B 11/26
See application file for complete search history.

(56) References Cited

U.S. PATENT DOCUMENTS 9,097,515 B2 * 8/2015 Lim ....................... G01B 11/14
9,111,978 B2 * 8/2015 Mori ................. H01L 21/67259
9,349,624 B2 5/2016 Wilby
9,352,466 B2 * 5/2016 Liao ....................... B25J 9/1692
10,494,178 B2 * 12/2019 Ito ........................... H01L 21/68
11,413,767 B2 * 8/2022 Shivanna .............. H01L 21/681
2003/0199173 A1 10/2003 Ogawa et al.
2011/0303125 A1 * 12/2011 Itou .................. H01L 21/67775 108/42
2013/0336749 A1 12/2013 Gilchrist et al.
2021/0252717 A1 * 8/2021 Lee ...................... B25J 11/0095
2022/0254666 A1 8/2022 Sadeghi et al.
2022/0399219 A1 12/2022 Wu et al.

FOREIGN PATENT DOCUMENTS

JP 2016047747 A * 4/2016
JP 2017-212322 A 11/2017
JP 2018-037559 A 3/2018
JP 2019-153720 A 9/2019
JP 2021-129024 A 9/2021
JP 2022-189768 A 12/2022
KR 1020060015945 A 2/2006
KR 10-2008-0055789 A 6/2008
KR 1020080055789 B1 6/2008
KR 102063654 B1 * 1/2020 ....... H01L 21/67766
KR 1020200137137 A 12/2020
KR 102218367 B1 2/2021
WO 2010-119846 A1 10/2010
WO WO-2022085236 A1 * 4/2022 ....... H01L 21/67126

* cited by examiner

| No | List | Value(mm) |
|---|---|---|
| 1 | Sen1 | 1.45 |
| 2 | Sen2 | 5.45 |
| 3 | Sen3 | 3.44 |

| No | List | Value(°) |
|---|---|---|
| 1 | X | 0° |
| 2 | Y | 3° |
| 3 | Z | 4° |

FIG. 15

| Header | Device number (Device identification number) | Loadport number | FOUP type | Get / Put | T-axis value / Z-axis value | Pressure | Height sensor | Horizontal sensorX |
|---|---|---|---|---|---|---|---|---|
| | | | | | | Temperature | Height sensor | Horizontal sensorY |
| | | | | | | Concentration | Height sensor | Horizontal sensorZ |

POSITION DETERMINATION APPARATUS FOR ROBOT DETECTION LASER SENSOR SYSTEM IN FOUP MOVABLE BY OHT

CROSS REFERENCE TO RELATED APPLICATION OF THE INVENTION

The present application claims priority to Korean Patent Application No. 10-2023-0022014 filed in the Korean Intellectual Property Office on Feb. 20, 2023, the entire contents of which are incorporated herein by reference.

BACKGROUND OF THE INVENTION

Field of the Invention

The present invention relates to a position determination apparatus for a robot detection laser sensor system in front-opening unified pods (hereinafter referred to as 'FOUPs') movable by an overhead hoist transport (hereinafter referred to as 'OHT').

Background of the Related Art

In a semiconductor manufacturing process, wafer processing is performed in a clean room so as to improve a yield and a quality of the processed wafers. However, as high integration of semiconductor devices, miniaturization of circuits, and enlargement of wafers in size have been developed, it is technically and economically hard to maintain the entire clean room to a clean level.

So as to solve such problems, recently, a degree of cleanliness is controlled only for the space around the wafers. In specific, the wafers are stored inside closed type storage pods called FOUPs. An equipment front end module (EFEM) is used to transfer the wafers between a processing device for performing wafer processing and the FOUPs.

The FOUPs transferred are placed on the EFEM of the processing device, and the EFEM opens the covers of the FOUPs to allow the wafers to be exposed to the outside. Further, an end-effector of an atmospheric transfer robot of each EFEM gets one wafer from a plurality of wafers loaded inside the corresponding FOUP, transfers the wafer to the processing chamber of the processing device, and puts the wafer finished in processing into the corresponding FOUP.

However, when the FOUP is mounted onto the EFEM, the FOUP may not be mounted horizontally on level onto the EFEM, so that it may be mounted twistedly thereonto. That is, the FOUP may be mounted inclinedly in a horizontal or vertical direction onto the EFEM.

If the FOUP is mounted twistedly onto the EFEM, the wafer may be scratched and thus damaged by wafer mounting rails of the FOUP when the end-effector enters the FOUP and thus performs the getting or putting operation for the wafer.

SUMMARY OF THE INVENTION

Accordingly, the present invention has been made in view of the above-mentioned problems occurring in the related art, and it is an object of the present invention to provide a position determination apparatus for a robot detection laser sensor system in FOUPs that is capable of sensing whether the FOUPs mounted onto loadports are inclined in horizontal and vertical directions to thus determine whether the FOUPs are mounted normally onto the loadports.

It is another object of the present invention to provide a position determination apparatus for a robot detection laser sensor system in FOUPs that is capable of determining whether getting and putting operations for wafers are performed accurately through the sensing of the transfer path of an end-effector.

To accomplish the above-mentioned objects, according to the present invention, there is provided a position determination apparatus for a robot detection laser sensor system in front-opening unified pods (FOUPs), including: an external server; and a wafer processing device for performing processing for wafers and transmitting integration management data to the external server.

According to the present invention, desirably, the wafer processing device may include: the FOUPs configured to accommodate the wafers therein; loadports to which the FOUPs are detachably coupled; processing chambers in which the processing for the wafers are performed; and an equipment front end module (EFEM) disposed between the processing chambers and the loadports and having an end-effector adapted to get the wafers out of the FOUPs into the processing chambers or put the wafers finished in processing in the processing chambers into the FOUPs.

According to the present invention, desirably, the wafer processing device may further include a controller for transmitting, if the FOUPs are seated onto the loadports, the transfer path data of the end-effector to the external server when the end-effector moves forward or backward toward and from the FOUPs.

According to the present invention, desirably, each FOUP may include: a housing having an entrance toward and from which the end-effector moves forward and backward; wafer mounting rails disposed spaced apart from one another by a given distance on both side inner walls of the housing in a height direction thereof to mount the wafers sequentially thereonto; T-axis sensors disposed on top and bottom of the entrance to sense a horizontal transfer path of the end-effector; a Z-axis sensor disposed on the inner bottom surface of the entrance to sense a vertical transfer height of the end-effector; and a loadport mounting plate disposed on the underside of the housing and electrically coupled to the corresponding loadport.

According to the present invention, desirably, each FOUP may further include: a sensor support plate mounted on the lowermost wafer mounting rails and having a plurality of height sensors disposed on top thereof to sense a height of the corresponding FOUP from the corresponding loadport; a horizontal sensor disposed on the surface of the sensor support plate to sense whether the housing is located horizontally on level; and a radio communication part disposed inside the housing to transmit the sensed values of the T-axis sensors and the Z-axis sensor, the angle values sensed by the horizontal sensor, and the height values sensed by the plurality of height sensors to the controller.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 15 is an exemplary view showing integration management data transmitted to an external server according to the present invention.

DETAILED DESCRIPTION OF THE PREFERRED EMBODIMENTS

Figure 1:
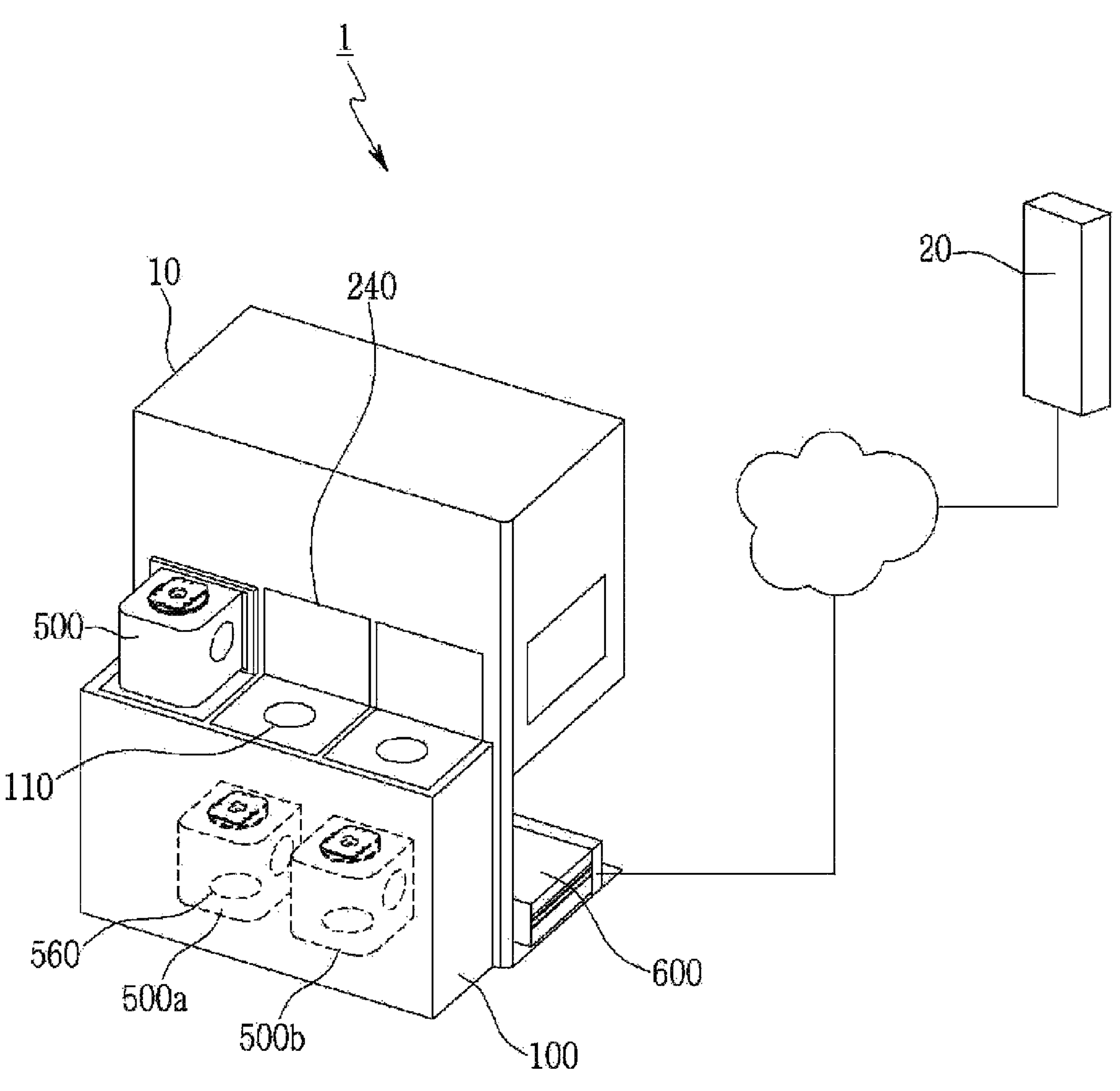
FIG. 1 is a schematic view showing a position determination apparatus for a robot detection laser sensor system in FOUPs according to the present invention.

Hereinafter, embodiments of the present invention will be explained in detail with reference to the attached drawings wherein the corresponding parts in the embodiments of the present invention are indicated by corresponding reference numerals and the repeated explanation on the corresponding parts will be avoided.

In the description, when it is said that one portion is described as "includes" any component, one element further may include other components unless no specific description is suggested.

Figure 2:
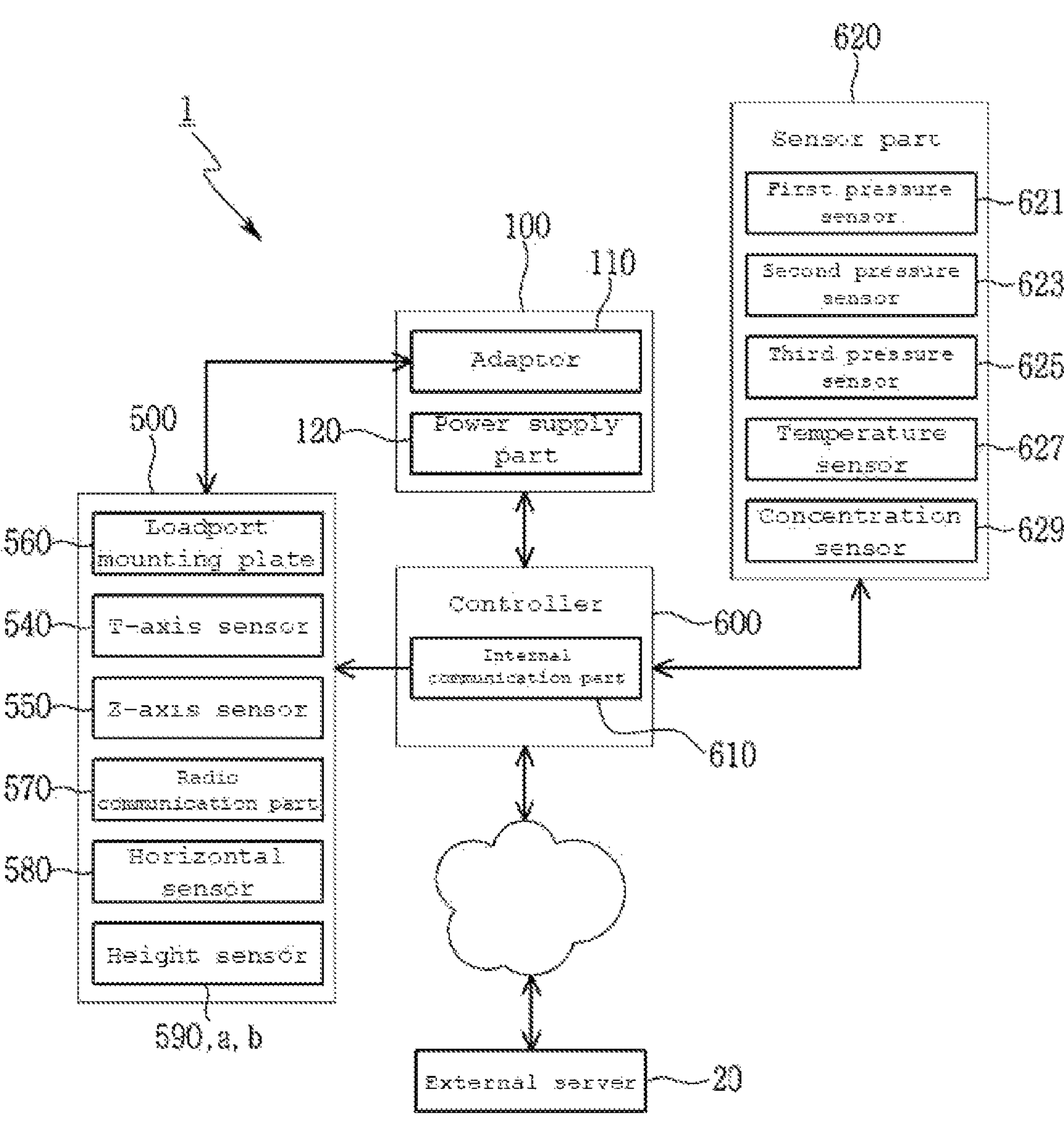
FIG. 2 is a block diagram showing an internal configuration of the position determination apparatus for a robot detection laser sensor system in FOUPs according to the present invention.
Figure 3:
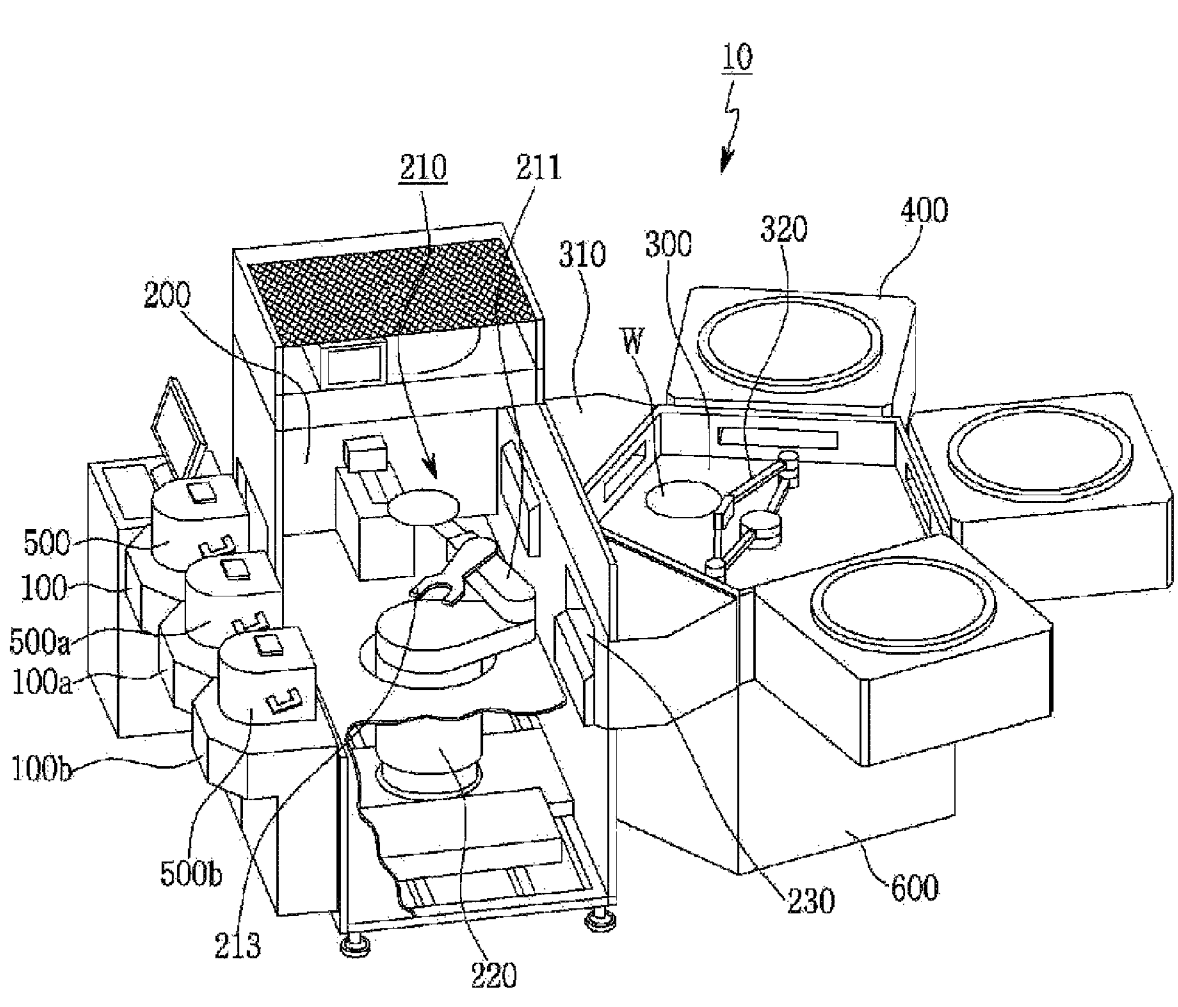
FIG. 3 is a perspective view showing a wafer processing device of the position determination apparatus of a robot detection laser sensor system in a FOUP according to the present invention.
Figure 4:
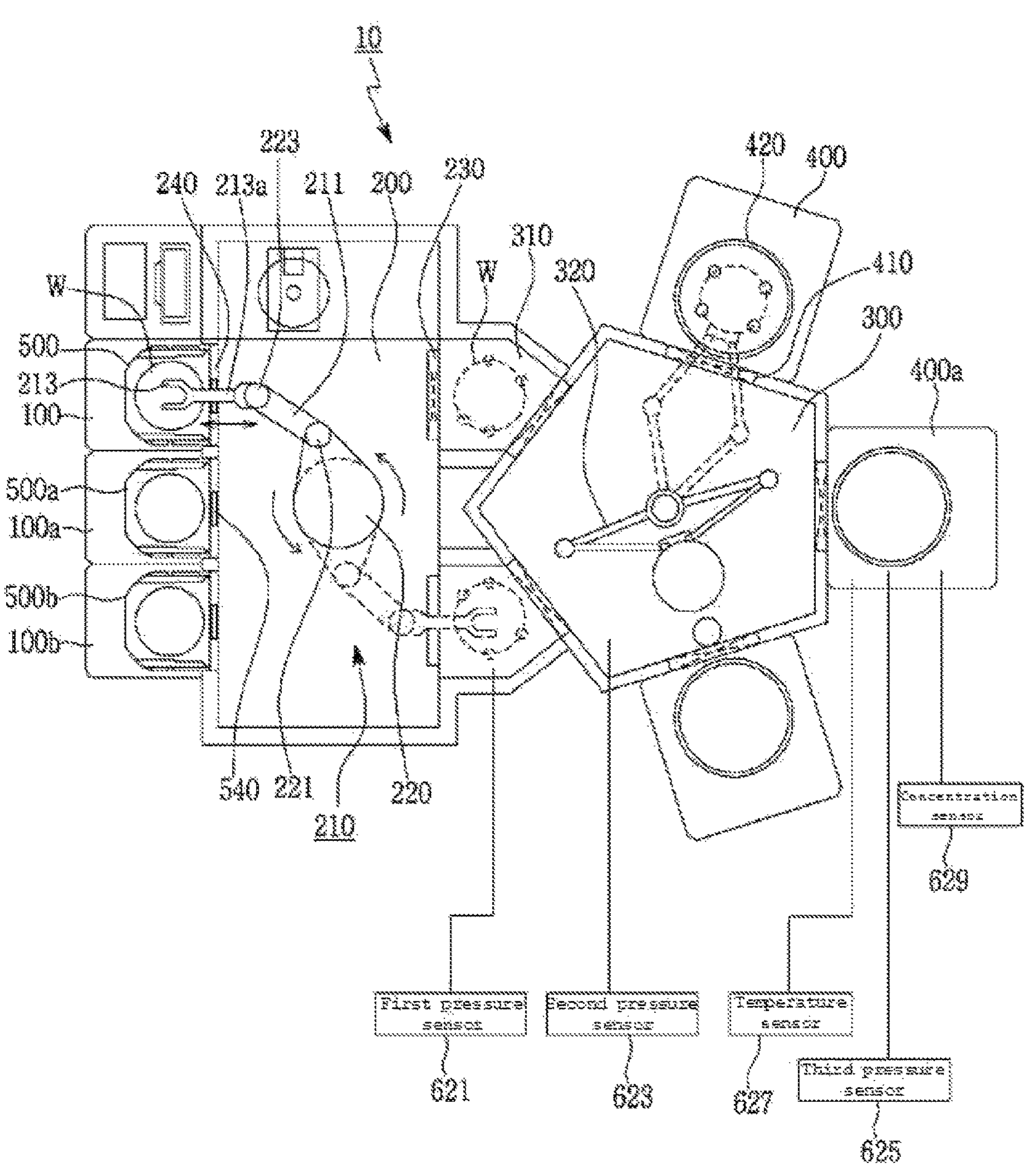
FIG. 4 is a plan view showing the wafer processing device according to the present invention.

FIG. 1 is a schematic view showing a position determination apparatus 1 for a robot detection laser sensor system in FOUPs according to the present invention, FIG. 2 is a block diagram showing an internal configuration of the position determination apparatus 1 for a robot detection laser sensor system in FOUPs according to the present invention, FIG. 3 is a perspective view showing a wafer processing device 10 of the position determination apparatus 1 according to the present invention, and FIG. 4 is a schematic plan view showing the wafer processing device 10 according to the present invention.

As shown in FIGS. 1 and 2, a position determination apparatus 1 of a robot detection laser sensor system in FOUPs according to the present invention serves to transmit integration management data of a wafer processing device 10 for performing wafer processing to an external server 20, while transmitting current internal operating situations of the wafer processing device 10 to the external server 20 accurately and quickly.

In FIGS. 1 and 2, a single wafer processing device 10 is connected to the external server 20, but a plurality of wafer processing devices 10 in which different processing for wafers is performed may be connected to the external server 20 through a communication network, so that integration management data of the respective wafer processing devices 10 are transmitted to the external server 20, thereby allowing the external server 20 to rapidly recognize current wafer processing situations of the respective wafer processing devices 10.

The wafer processing device 10 performs various processing for wafers W. The wafer processing device 10 includes processing chambers 400 in which processing for the wafers W is conducted, a stage 300 for supporting the processing chambers 400, an EFEM 200 coupled to the front end of the stage 300 and having an end-effector 213 disposed therein to get or put the wafers W out of and into the stage 300, loadports 100, 100*a*, and 100*b* coupled to the EFEM 200, FOUPs 500, 500*a*, and 500*b* detachably seated onto the loadports 100, 100*a*, and 100*b* and having the wafers W loaded therein, and a controller 600 adapted to control the above-mentioned parts, integrate the data received from the respective parts to produce integration management data, and transmit the produced integration management data to the external server 20.

The processing chambers 400 and the stage 300 operate at a vacuum pressure, and the loadports 100, 100*a*, and 100*b* and the EFEM 200 operate an atmospheric pressure. A vacuum pressure and an atmospheric pressure are alternately formed in buffering chambers 310 of the stage 300.

The wafer processing device 10 according to the present invention determines whether the FOUPs 500, 500*a*, and 500*b* are seated horizontally on level onto the loadports 100, 100*a*, and 100*b* at right positions, without any twist, when they are mounted thereonto, thereby protecting the wafers W from the damages caused by the twisted mounting of the FOUPs 500, 500*a*, and 500*b*.

Further, the wafer processing device 10 includes sensors disposed inside the FOUPs 500, 500*a*, and 500*b* to sense a transfer path of the end-effector 213 so that it can quickly determine whether the end-effector 213 is wrongly transferred in the process of getting or putting the wafer W to thus prevent the wafer W from being damaged.

Through the sensors disposed inside the FOUPs 500, 500*a*, and 500*b*, further, the controller 600 determines whether the end-effector 213 performs the operation of getting or putting the wafer W well.

Further, device operation data, which are received from various device sensors disposed inside the wafer processing device 10, are transmitted to the form of the integration management data to the external server 20, together with the transfer path data of the end-effector 213 that are sensed through the sensors, so that the external server 20 performs the management of the wafer processing device 10 integratedly and quickly.

As shown in FIGS. 3 and 4, the loadports 100, 100*a*, and 100*b* are coupled to the front end of the EFEM 200 to support the FOUPs 500, 500*a*, and 500*b*. The FOUPs 500, 500*a*, and 500*b* are mounted correspondingly on tops of the loadports 100, 100*a*, and 100*b*. The loadports 100, 100*a*, and 100*b* have adaptors 110 disposed on tops thereof and thus electrically connected to the FOUPs 500, 500*a*, and 500*b*.

Further, loadport mounting plates 560, which are disposed on the undersides of the FOUPs 500, 500*a*, and 500*b*, are located on tops of the adaptors 110.

Even though not shown in the drawings, the adaptors 110 have RFID tags (not shown). The RFID tags recognize the FOUPs 500, 500*a*, and 500*b* mounted onto the adaptors 110 and thus transmit the information of the corresponding FOUPs to the external server 20.

Figure 6:
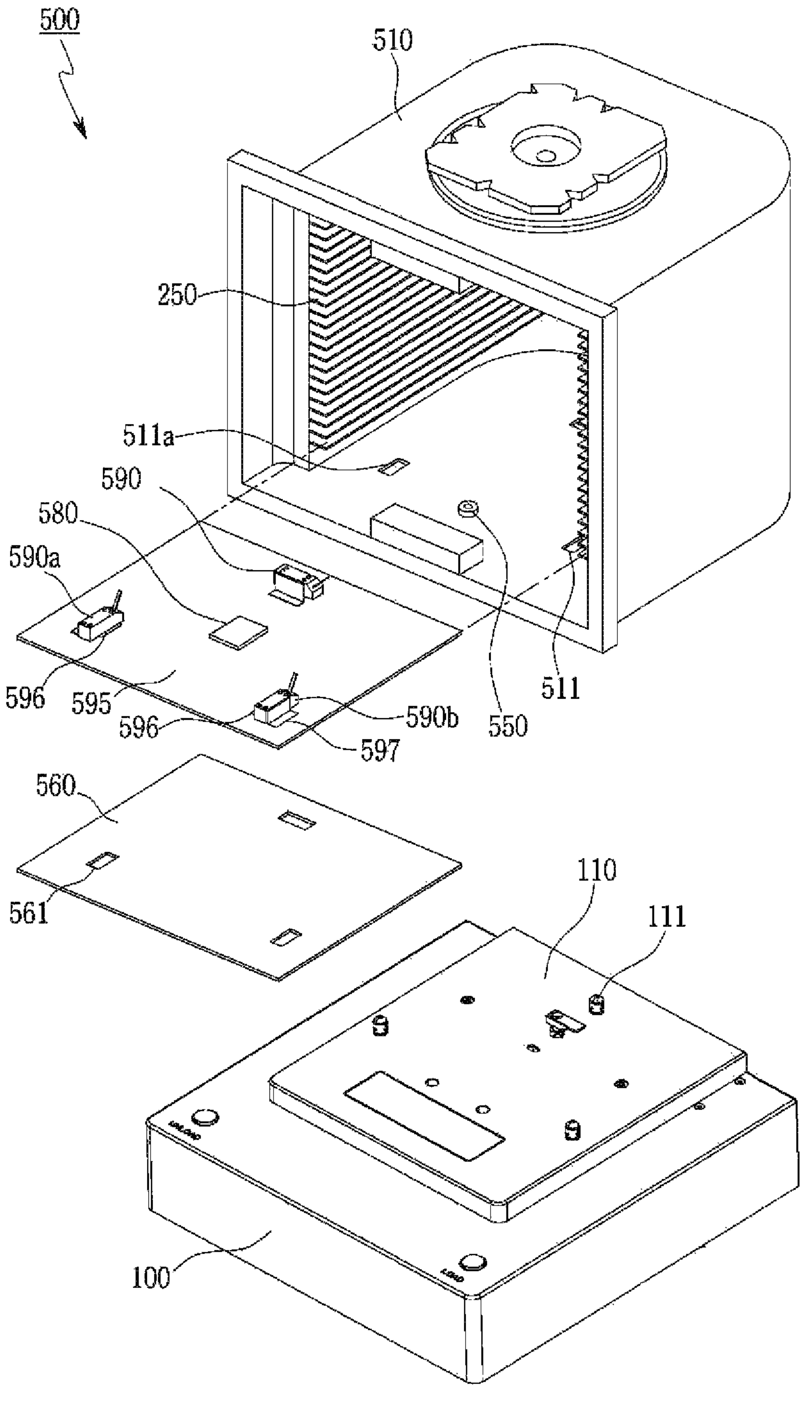
FIG. 6 is an exploded perspective view showing the FOUP and an adaptor according to the present invention.

As shown in FIG. 6, the adaptors 110 each have a plurality of position fixing pins 111 protruding from top thereof to determine the mounted positions of the loadport mounting plates 560 located on the undersides of the FOUPs 500, 500*a*, and 500*b*. The position fixing pins 111 protrude from top of each adaptor 110 by a given height.

In this case, three position fixing pins 111 are located to a triangular shape on the surface of each adaptor 110, and otherwise, four position fixing pins 111 may be located to a square shape. In some cases, five or more position fixing pins 111 may be located thereon.

Figure 10:
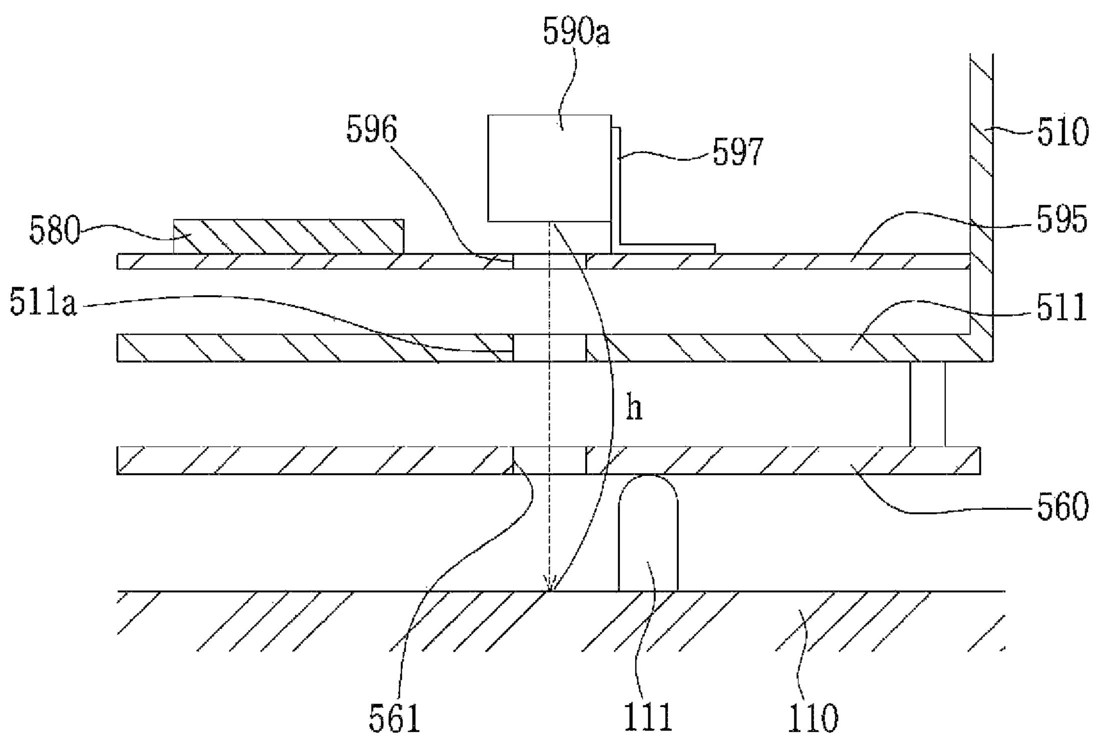
FIG. 10 is an exemplary sectional view showing a process of sensing a height by height sensors according to the present invention.

The position fixing pins 111 have the same height as one another, and as shown in FIG. 10, they contactedly support the underside of the corresponding loadport mounting plate 560. Each loadport mounting plate 560 is mounted on tops of the position fixing pins 111, while being spaced apart from the adaptor 110 by the given distance.

Even though not shown in the drawings, each position fixing pin 11 has a contact sensor adapted to detect whether the corresponding loadport mounting plate 560 comes in contact therewith and thus transmit the sensed result to the controller 600.

The EFEM 200 transfers the wafers W between the FOUPs 500, 500*a*, and 500*b* mounted on the loadports 100, 100*a*, and 100*b* and the buffering chambers 310 of the stage 300. The EFEM 200 includes an atmospheric transfer robot 210 for transferring the wafers W and a transfer robot driver 220 for driving the atmospheric transfer robot 210.

The atmospheric transfer robot 210 serves to get the wafers not processed out of the FOUPs 500, 500*a*, and 500*b* to thus load them to the buffering chambers 210 and unload the wafers finished in processing from the processing chambers 400 to thus put them into the FOUPs 500, 500*a*, and 500*b*. The atmospheric transfer robot 210 includes a rotary arm 211 and the end-effector 213 disposed on an end of the rotary arm 211 to transfer the wafers W.

The transfer robot driver 220 operates the atmospheric transfer robot 210 to allow the end-effector 213 to get or put the wafers W sequentially according to the teaching values set upon the installation of the device.

The transfer robot driver 220 includes a plurality of spindles 221 and 223 for rotating the rotary arm 211 and the end-effectors 213.

As shown in FIG. 4, the end-effector 213 is folded or unfolded to and from the rotary arm 211 according to the rotational directions of the spindles 221 and 223 and thus inserted into the interiors of the FOUPs 500, 500*a*, and 500*b* through FOUP entrances 240 or into the buffering chambers 310 through buffering chamber entrances 230.

The end-effector 213 is configured to allow the wafer W to be located on top thereof. The end-effector 213 has various shapes capable of locating the wafer W on top thereof. The end-effector 213 has a bar-shaped end-effector arm 213*a* extending from the rear side thereof by a given length.

The stage 300 serves to support the processing chambers 400 and includes the buffering chambers 310 connected to the EFEM 200 and a return robot 320. The stage 300 has a polygonal shape, and the processing chambers 400 and the buffering chambers 310 are located on the respective sides of the polygonal stage 300.

The wafer not processed yet and the wafer finished in processing, which are transferred by the end-effector 213, are located in the pair of buffering chambers 310. The return robot 320 serves to load the wafer not processed located in the corresponding buffering chamber 310 onto the corresponding processing chamber 400 or unload the wafer finished in processing in the corresponding processing chamber 400 onto the corresponding buffering chamber 310.

The processing chambers 400 perform the processing for the wafers W. Each processing chamber 400 has a susceptor 420 on which the wafer W is loaded. The processing chambers 400 are configured to perform various wafer processing operations. For example, they may become ashing chambers for removing photoresists, chemical vapor deposition (CVD) chambers for depositing insulation films, or etch chambers for etching apertures or openings on insulation films to form interconnection structures. Otherwise, they may become physical vapor deposition (PVD) chambers for depositing barrier films or metal films.

In this case, as shown in FIG. 4, a sensor part 620 is located in the buffering chambers 310, the stage 300, and the processing chambers 400 to sense the current operation situations of the device. The sensor part 620 includes a plurality of pressure sensors 621, 623, and 625, a temperature sensor 627, and a concentration sensor 629 that are adapted to sense the pressures, temperature, plasma gas concentration, the number of wafers to be processed, and the like inside the buffering chambers 310, the stage 300, and the processing chambers 400. In addition thereto, various sensors may be provided to sense the current operation situations of the device. The sensor part 620 transmits the sensed current operation situations of the device to the controller 600 in real time.

The FOUPs 500, 500*a*, and 500*b* are configured to accommodate the wafers W therein and detachably coupled to another wafer processing device to allow different processing from the processing of the wafer processing device 10 to be performed sequentially. As shown in FIG. 1, the FOUPs 500, 500*a*, and 500*b* are mounted on tops of the loadports 100, 100*a*, and 100*b*.

According to the present invention, the FOUPs 500, 500*a*, and 500*b* are configured to build the sensors for sensing the transfer path of the end-effector 213 therein when the end-effector 213 moves forward or backward toward and from the FOUPs 500, 500*a*, and 500*b*. Further, the FOUPs 500, 500*a*, and 500*b* transmit the sensed transfer path data of the end-effector 213 to the controller 600 by means of the power of batteries (not shown) built therein.

In this case, the wafer processing device 10 according to the present invention is configured to allow the sensors for sensing the transfer path of the end-effector 213 to be built in the FOUPs 500, 500*a*, and 500*b*, so that it is easier to perform construction or maintenance when compared with the conventional practice in which the sensors are disposed on the FOUP entrances of the stage. Further, the FOUPs 500, 500*a*, and 500*b* are separable so that even when the sensors are installed or repaired, advantageously, there is no need to stop the operation of the wafer processing device 10.

Figure 5:
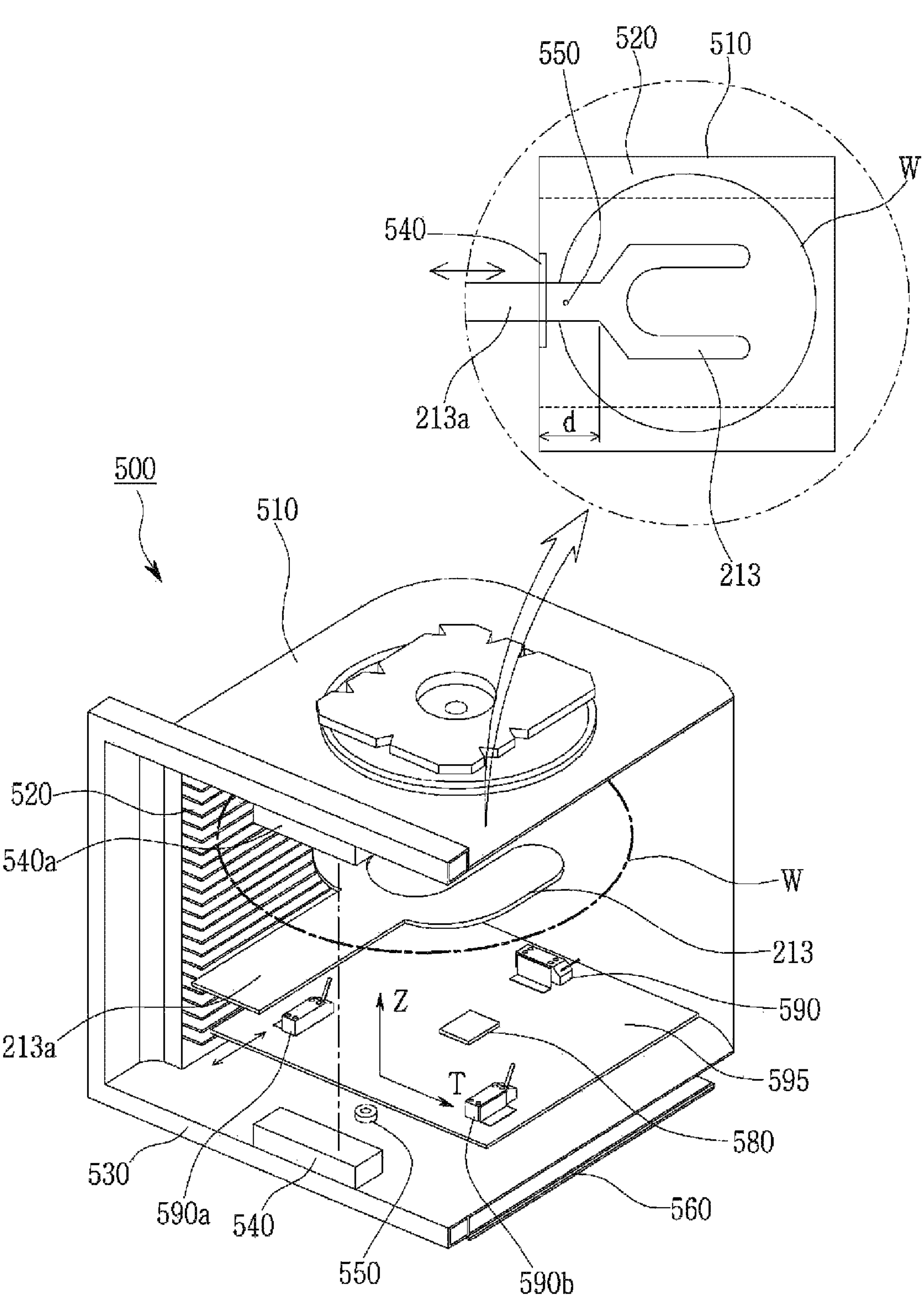
FIG. 5 is a perspective view showing the FOUP according to the present invention.
Figure 7:
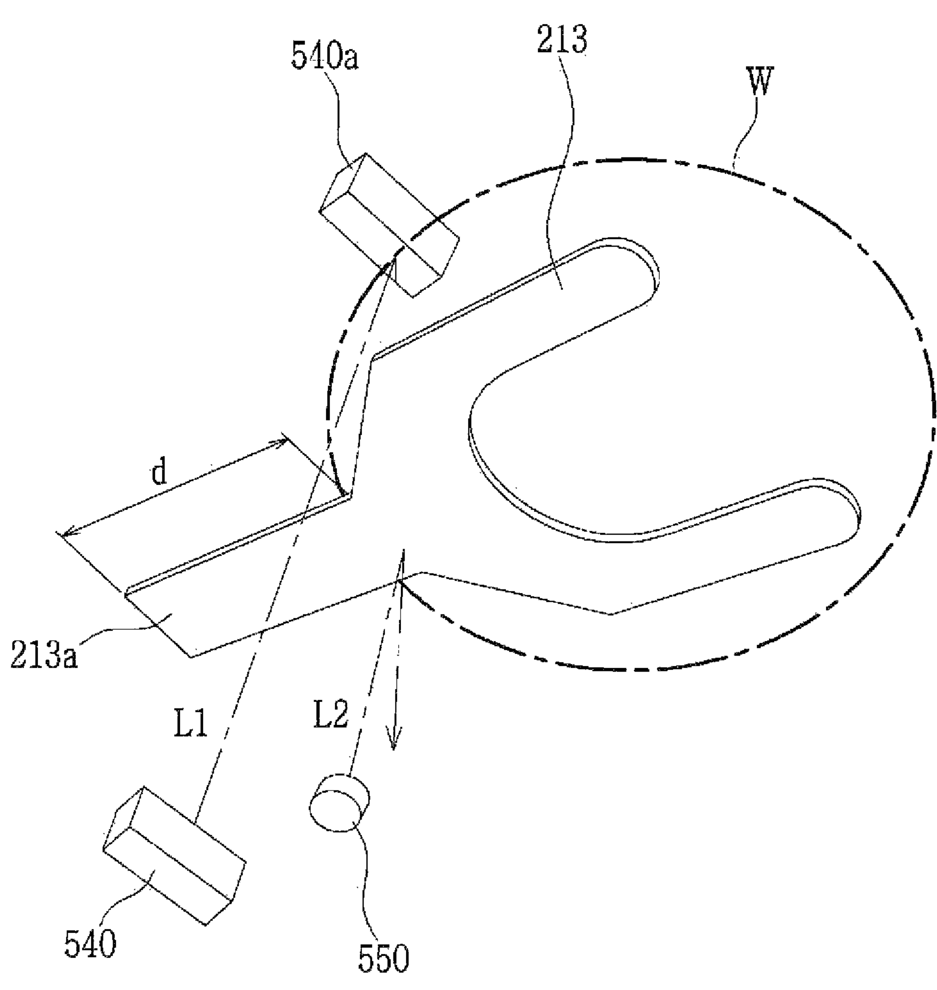
FIG. 7 is a perspective view showing transfer path sensors of the FOUP according to the present invention.

FIG. 5 is a perspective view showing the FOUP 500, FIG. 6 is an exploded perspective view showing the FOUP 500, and FIG. 7 is an exemplary view showing a process of sensing a transfer path of the end-effector 213 in each FOUP 500, 500*a*, or 500*b*.

Each FOUP 500, 500*a*, or 500*b* includes a box-shaped housing 510, wafer mounting rails 520 disposed spaced apart from one another by a given distance on both side inner walls of the housing 510 in a height direction thereof to thus mount the wafers W thereonto, an entrance 530 located to face the corresponding FOUP entrance 240 of the EFEM 200, T-axis sensors 540 and 540*a* disposed on the entrance 530 to sense a horizontal (T-axis) transfer path of the end-effector 213, a Z-axis sensor 550 disposed on the inner bottom surface of the entrance 530 to sense a vertical (Z-axis) transfer height of the end-effector 213, the loadport mounting plate 560 disposed on the underside of the housing 510 and electrically coupled to the adaptor 110 of the corresponding loadport 100, 100*a*, or 100*b*, and a radio communication part 570 disposed therein to transmit the transfer path data sensed by the T-axis sensors 540 and 540*a* and the Z-axis sensor 550 to the controller 600.

Further, each FOUP 500, 500*a*, or 500*b* includes a horizontal sensor 580 for sensing whether it is located horizontally on level and a plurality of height sensors 590, 590*a*, and 590*b* disposed above a bottom 511 of the housing 510 to sense heights between the housing 510 and the adaptor 110.

If the FOUP 500, 500*a*, or 500*b* are mounted on the corresponding loadports 100, 100*a*, and 100*b*, the loadport mounting plates 560 disposed on the undersides of the housings 510 come into contact with the position fixing pins 111 of the adaptors 110 of the loadports 100, 100*a*, and 100*b*. The respective loadports 100, 100*a*, and 100*b* have loadport numbers assigned by the external server 20.

If the transfer path data are transmitted from the radio communication part 570 to the controller 600, the corresponding loadport numbers are also transmitted, so that the controller 600 and the external server 20 identify the positions of the loadports 100, 100*a*, and 100*b* from which the transfer path data are transmitted.

The wafer mounting rails 520 are disposed on both side inner walls of the housing 510 in the height direction of the housing 510, so that the wafers W are disposed inside the wafer mounting rails 520, while being spaced apart from one another.

Even though not shown, caps are coupled to the entrances 530. If the FOUPs 500, 500*a*, and 500*b* are connected to the loadports 100, 100*a*, and 100*b*, the caps are open to allow the entrances 530 to communicate with the FOUP entrances 240, so that the end-effector 213 moves forward or backward toward and from the entrances 530.

The end-effector 213 moves according to the teaching information received from the external server 20. The T-axis sensors 540 and 540*a* and the Z-axis sensor 550 serve to sense the transfer path of the end-effector 213 to thus determine whether the end-effector 213 transfers the wafer W at a right position according to the teaching information and thus transmit the sensed results to the controller 600.

The T-axis sensors 540 and 540*a* are disposed on the entrance 530 to sense the horizontal transfer path of the end-effector 213 moving to the interior of each FOUP 500, 500*a*, or 500*b* or moving to the outside from each FOUP 500, 500*a*, or 500*b*. The T-axis sensors 540 and 540*a* sense whether the end-effector 213 is transferred horizontally on level at the right position. In specific, the T-axis sensors 540 and 540*a* sense whether the end-effector 2132 is transferred shiftedly or twistedly from the right position.

As the T-axis sensors 540 and 540*a* are used optical sensors for irradiating a light source to obtain information. In specific, the T-axis sensor 540 is a light-emitting sensor disposed on the bottom of the entrance 530 to irradiate light, and the T-axis sensor 540*a* is a light-receiving sensor disposed on the top of the entrance 530 at a corresponding position to the light-emitting sensor 540 to receive the light generated from the light-emitting sensor.

The light-emitting sensor 540 is disposed on the bottom of the entrance 530 so as to irradiate the light source onto the underside of the wafer W because the pattern formed on top of the wafer W may be damaged by the light source generated therefrom. The light-receiving sensor 540*a* receives the light generated from the light-emitting sensor 540, outputs an output value varied according to the quantity of light received as an electrical signal, and transmits the electrical signal to the controller 600. A photodiode, a PDS, and the like may be used as the light-receiving sensor 540*a*.

The reason why the optical sensors are used as the T-axis sensors 540 and 540*a* is because the optical sensors are relatively free from surrounding noise and have lower measurement errors when compared with other types of sensors, thereby obtaining accurate results. Further, the optical sensors are smaller in size when compared with other types of sensors, so that they are easy to be mounted inside the FOUPs 500, 500*a*, and 500*b* narrow in internal spaces thereof.

The information acquired by the T-axis sensors 540 and 540*a* may be at least any one of the existence or non-existence, transfer position, a degree of twist, and shift or non-shift of the end-effector 213. If the light-receiving sensor 540*a* receives 100% of the light source, without any interference with the wafer or the end-effector 213, it is determined that the wafer or the end-effector 213 does not exist on the path along which the light source passes, and contrarily, if the light-receiving sensor 540*a* does not receive at least a portion of the light source because of the interference with the wafer or the end-effector 213, it is determined that the wafer or the end-effector 213 exists on the path along which the light source passes.

The transfer position, the degree of twist, and the shift or non-shift of the end-effector 213 are checked by the irradiated time of the light source from the light-emitting sensor 540 and the received area of the light source from the light-receiving sensor 540*a*.

In this case, as shown in FIG. 7, the T-axis sensors 540 and 540*a* transmit the position information of the end-effector 213 and the end-effector arm 213*a* entering the entrance 530 to the controller 600. The controller 600 filters only the area corresponding to a length d of the end-effector arm 213*a* from the T-axis position information received from the light-receiving sensor 540*a* and thus produces the filtered area as the transfer path data.

If the light source is irradiated in a state where the wafer W is located on the end-effector 213, diffused reflection occurs, and accordingly, only the data value of the area corresponding to the end-effector arm 213*a* where the diffused reflection does not occur, is extracted as the transfer path data.

Figures 8A, 8B, 8C:
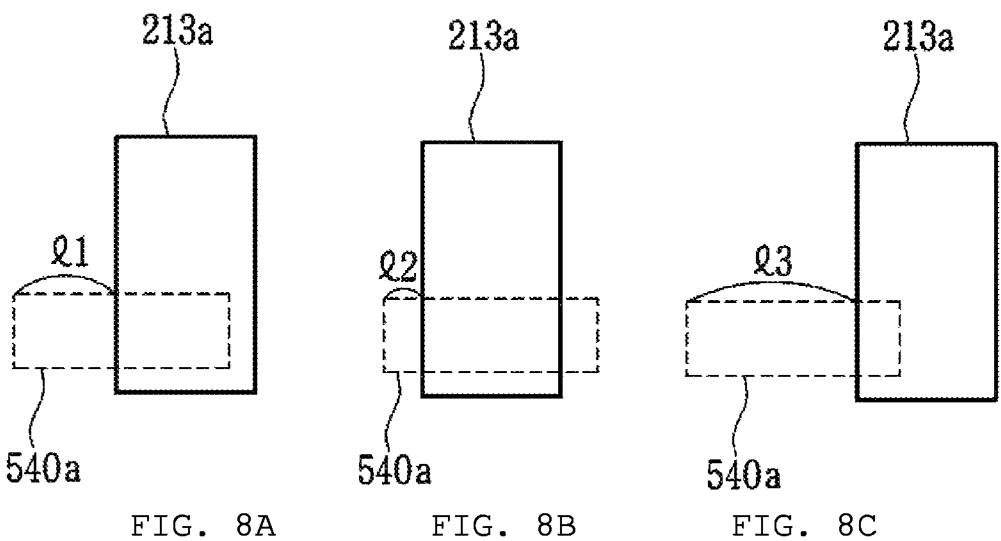
FIGS. 8A, 8B, 8C, 8D, 8E and 9 are exemplary views showing an end-effector transfer path sensing procedure of T-axis sensors of the FOUP according to the present invention.
Figures 8D, 8E:
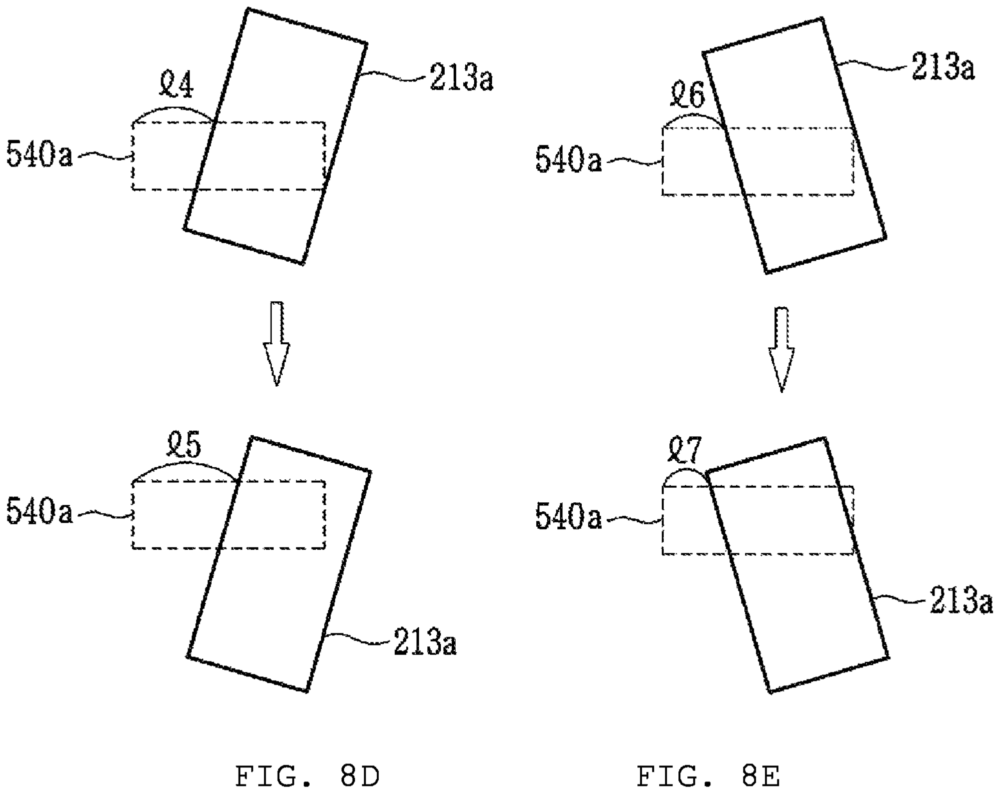
Figure 9:
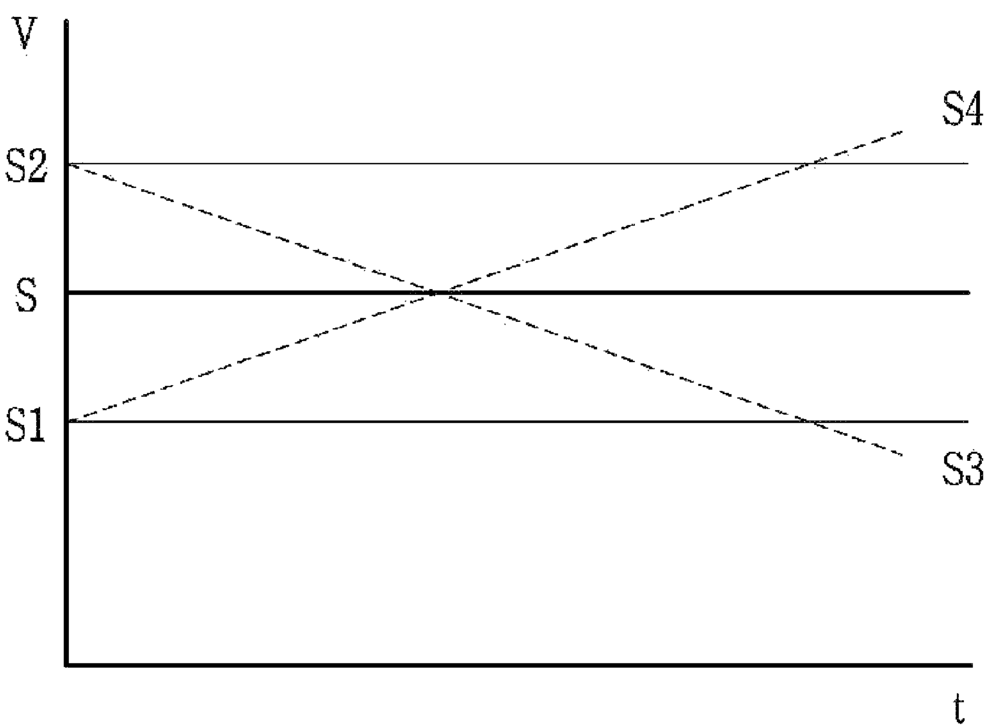

FIGS. 8A to 8E are exemplary views showing various examples of the paths of the end-effector arm 213*a* sensed by the T-axis sensors 540 and 540*a*, and FIG. 9 is an exemplary view showing examples of the electrical signals transmitted to the controller 600 from the light-receiving sensor 540*a*.

FIG. 8A is an exemplary view showing a state where the end-effector arm 213*a* moves along a normal transfer path according to the teaching information. The end-effector arm 213*a* moves in a direction perpendicular to the light-receiving sensor 540*a*, and in this case, the end-effector arm 213*a* moves to hide a given area of the light-receiving sensor 540*a*, that is, 50% of the area of the light-receiving sensor 540*a*.

The state where 50% of the area of the light-receiving sensor 540*a* is hidden is a reference for determining whether the end-effector arm 213*a* moves along the normal transfer path, so that it is checked whether the end-effector arm 213*a* is shifted or twistedly inclined in any direction.

If the end-effector arm 213*a* passes through the entrance 530 of the FOUP 500, 500*a*, or 500*b* and hides 50% of the area of the light-receiving sensor 540*a*, the output value (voltage) of the light-receiving sensor 540*a* is constantly produced as a reference value S of FIG. 9.

FIG. 8B is an exemplary view showing a state where the end-effector arm 213*a* is shifted in position to the left side of the light-receiving sensor 540*a*, and FIG. 8C is an exemplary view showing a state where the end-effector arm 213*a* is shifted in position to the right side of the light-receiving sensor 540*a*.

As shown in FIG. 8B, if the end-effector arm 213*a* is shifted in position to the left side of the light-receiving sensor 540*a*, a larger area of the light-receiving sensor 540*a* than the area of the light-receiving sensor 540*a* hidden by the end-effector arm 213*a* moving to the normal transfer path as shown in FIG. 8A is hidden (l1>l2), so that the voltage outputted from the light-receiving sensor 540*a* is produced as an output value S1 lower than the reference value S, as shown in FIG. 9.

As shown in FIG. 8C, further, if the end-effector arm 213*a* is shifted in position to the right side of the light-receiving sensor 540*a*, a smaller area of the light-receiving sensor 540*a* than the area of the light-receiving sensor 540*a* hidden by the end-effector arm 213*a* moving to the normal transfer path as shown in FIG. 8A is hidden (l1<l3), so that the voltage outputted from the light-receiving sensor 540*a* is produced as an output value S2 higher than the reference value S, as shown in FIG. 9.

The voltage values (or output values) of the light-receiving sensor 540*a* are changed in a straight line direction of the end-effector arm 213*a*, but it can be appreciated that the end-effector arm 213 moves shiftedly to the left or right side of the light-receiving sensor 540*a* from the normal transfer path thereof.

Contrarily, FIGS. 8D and 8E show examples in which the end-effector arm 213*a* moves inclinedly from the normal transfer path thereof. FIG. 8D shows a state where the end-effector arm 213 is inclined in a right direction in the drawing and thus moves to the interior of the FOUP 500, 500*a*, or 500*b*, and FIG. 8E shows a state where the end-effector arm 213 moves inclinedly in a left direction in the drawing.

As shown in FIG. 8D, if the end-effector arm 213*a* moves inclinedly toward the right side, it enters the interior of the FOUP 500, 500*a*, or 500*b* as time passes, so that an area of the light-receiving sensor 540*a* hidden by the end-effector arm 213*a* becomes small (l4<l5). As a result, the voltage outputted from the light-receiving sensor 540*a* is produced as an output value S3 moving from a high voltage value to a low voltage value as time passes, as shown in FIG. 9.

As shown in FIG. 8E, if the end-effector arm 213*a* moves inclinedly toward the left side from the normal transfer path thereof, it enters the interior of the FOUP 500, 500*a*, or 500*b* as time passes, so that an area of the light-receiving sensor 540*a* hidden by the end-effector arm 213*a* becomes large (l6>l7). As a result, if the voltage value is set high in proportion to the area hidden, the voltage outputted from the light-receiving sensor 540*a* is produced as an output value S4 moving from a low voltage value to a high voltage value as time passes, as shown in FIG. 9.

The Z-axis sensor 550 serves to sense the Z-axis transfer height of the end-effector arm 213*a* entering the interior of the FOUP 500, 500*a*, or 500*b*. The Z-axis sensor 550 is disposed on the inner bottom of the entrance 530, and as shown in FIG. 7, a laser sensor, which irradiates light onto the end-effector 213 to sense the height of the end-effector arm 213*a* through the time required to receive the light reflected onto the end-effector 213, is used as the Z-axis sensor 550.

If the time required to receive the light reflected onto the end-effector 213 is constant when the end-effector arm 213*a* enters the entrance 530, the Z-axis sensor 550 determines that the end-effector arm 213*a* moves horizontally on level, and contrarily, if the time required to receive the light reflected onto the end-effector 213 is changed when the end-effector arm 213*a* enters the entrance 530, the Z-axis sensor 550 determines that the end-effector arm 213*a* enters the entrance 530 in a twisted or inaccurate position.

The loadport mounting plates 560 are mounted on the adaptors 110 of the loadports 100, 100*a*, and 100*b*.

As shown in FIG. 6, each loadport mounting plate 560 has a plurality of lower through holes 561 formed thereon. The plurality of lower through holes 561 are formed on positions spaced apart from the position fixing pins 111 of the adaptor 110 by a given distance.

The radio communication part 570 performs radio communication with an internal communication part 610 of the controller 600, if the FOUPs 500, 500*a*, and 500*b* are mounted onto the EFEM 200, and thus transmits the real-time transfer path data of the end-effector 213 sensed by the Z-axis sensor 550 and the T-axis sensors 540 and 540*a* to the internal communication part 610 of the controller 600.

As shown in FIG. 6, the horizontal sensor 580 is disposed on top of a sensor support plate 595, senses angles of the X, Y, and Z-axes of the corresponding FOUP 500, 500*a*, or 500*b* when the FOUP 500, 500*a*, or 500*b* is mounted onto the corresponding adaptor 110, and thus transmits the sensed angles to the controller 600. The controller 600 senses the degree of twist of the corresponding FOUP 500, 500*a*, or 500*b* through the angle values of the X, Y, and Z-axes sensed by the horizontal sensor 580.

The height sensors 590, 590*a*, and 590*b* are disposed on top of the sensor support plate 595 accommodated into the FOUP 500, 500*a*, or 500*b*, sense heights of the corresponding FOUP 500, 500*a*, or 500*b* from the adaptor 110, and thus transmit the sensed heights to the controller 600. The controller 600 senses the degree of twist of the corresponding FOUP 500, 500*a*, or 500*b* through a deviation in the heights h sensed by the height sensors 590, 590*a*, and 590*b*.

The sensor support plate 595 is detachably coupled to the lowermost rails of the wafer mounting rails 520 disposed in the housing 510.

In this case, as shown in FIG. 6, the position fixing pins 111 are located to the triangular shape on the surface of each adaptor 110, and the lower through holes 561 are formed spaced apart from the position fixing pins 111 of the adaptor 110 on the loadport mounting plate 560.

Further, upper through holes 511*a* are formed on the bottom 511 of the housing 510 in positions coaxially with the lower through holes 561 of the loadport mounting plate 560.

The height sensors 590, 590*a*, and 590*b* are spaced apart from tops of respective height sensing holes 596 by a given height. To do this, sensor fixing brackets 597 are disposed on the sensor support plate 595 to allow the height sensors 590, 590*a*, and 590*b* to be located above the respective height sensing holes 596.

FIG. 10 is an exemplary sectional view showing a process of sensing heights between the height sensors 590, 590*a*, and 590*b* and the adaptor 110. The laser sensors are provided as the height sensors 590, 590*a*, and 590*b*, and laser light is emitted to the height sensing holes 596.

If the loadport mounting plate 560 is mounted onto the adaptor 110, it is seated onto tops of the position fixing pins 111. The height sensors 590, 590*a*, and 590*b* sense the heights h from the adaptor 110 through the time during which the laser light emitted from the height sensors 590, 590*a*, and 590*b* passes through the height sensing holes 596, the upper through holes 511*a*, and the lower through holes 561, is reflected onto the surface of the adaptor 110, and is thus received. The heights sensed by the height sensors 590, 590*a*, and 590*b* are transmitted to the controller 600.

If the heights sensed by the height sensors 590, 590*a*, and 590*b* are the same as one another, it is determined that the corresponding FOUP 500, 500*a*, or 500*b* is mounted horizontally on level, and contrarily, if the heights sensed by the height sensors 590, 590*a*, and 590*b* are different from one another, it is determined that the corresponding FOUP 500, 500*a*, or 500*b* is mounted twistedly on level.

Figure 11:
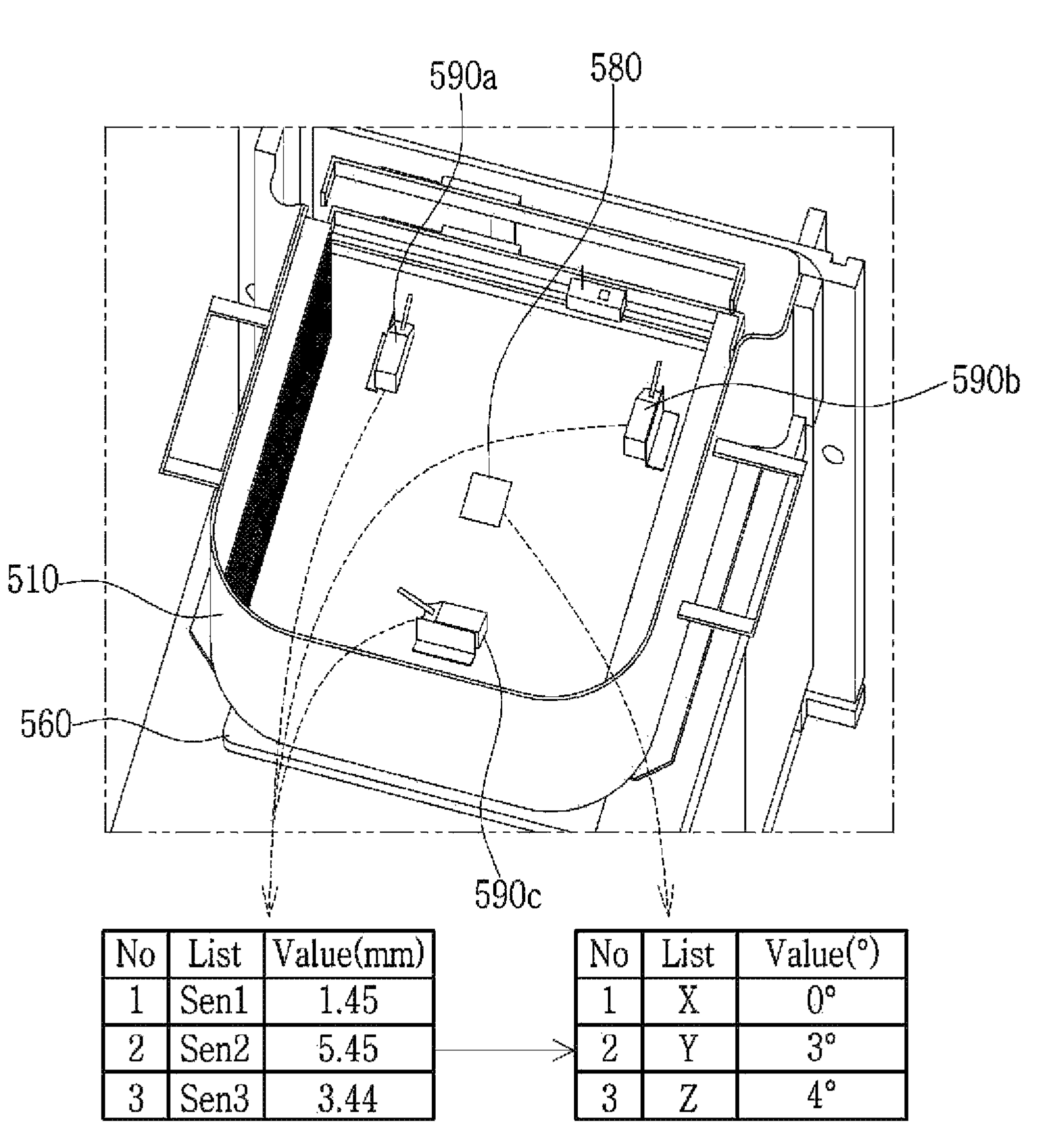
FIG. 11 is an exemplary view showing sensing results of a horizontal sensor and the height sensors according to the present invention.

FIG. 11 is an exemplary view showing sensing results of the horizontal sensor 580 and the height sensors 590, 590*a*, and 590*b* for the mounted state of the corresponding FOUP 500, 500*a*, or 500*b*. As shown, if the corresponding FOUP 500, 500*a*, or 500*b* is mounted on the adaptor 110, the horizontal sensor 580 senses whether the corresponding FOUP 500, 500*a*, or 500*b* is mounted horizontally on level.

As shown, the horizontal sensor 580 senses the angles of the X, Y, and Z-axes, and the height sensors 590, 590*a*, and 590*b* sense the heights from the adaptor 110 in their position.

If the X-axis angle of 0°, the Y-axis angle of 3°, and the Z-axis angle of 4° are sensed by the horizontal sensor 580 and the height of 1.45 mm sensed by the first height sensor 590, the height of 5.45 mm sensed by the second height sensor 590*a*, and the height of 3.44 mm sensed by the third height sensor 590*b* are obtained, the controller 600 determines that the corresponding FOUP 500, 500*a*, or 500*b* is mounted twistedly on the adaptor 110.

If it is determined that the corresponding FOUP 500, 500*a*, or 500*b* is mounted twistedly on the adaptor 110 through the sensing results of the horizontal sensor 580 and the height sensors 590, 590*a*, and 590*b*, the controller 600 transmits an alarm protocol to the external server 20 so that the corresponding FOUP 500, 500*a*, or 500*b* stops performing a getting or putting command.

The controller 600 controls the parts constituting the position determination apparatus, so that if the FOUPs 500, 500*a*, and 500*b* are mounted onto the loadports 100, 100*a*, and 100*b*, the wafer not processed is transferred to the corresponding processing chamber 400 and then subjected to the corresponding processing, and contrarily, the wafer finished in processing is transferred to the corresponding FOUP 500, 500*a*, or 500*b*.

If the FOUPs 500, 500*a*, and 500*b* are mounted onto the loadports 100, 100*a*, and 100*b*, the controller 600 receives the angle values and the height values from the horizontal sensor 580 and the height sensors 590, 590*a*, and 590*b* of the corresponding FOUP 500, 500*a*, or 500*b* and thus determines whether the corresponding FOUP 500, 500*a*, or 500*b* is mounted in position onto the corresponding loadport 100, 100*a*, or 100*b*, without any twist.

If the corresponding FOUP 500, 500*a*, or 500*b* is mounted in position onto the corresponding loadport 100, 100*a*, or 100*b*, without any twist, the controller 600 transmits a protocol to the external server 20 so that the corresponding FOUP 500, 500*a*, or 500*b* performs the getting or putting command.

Contrarily, if the corresponding FOUP 500, 500*a*, or 500*b* is mounted twistedly onto the corresponding loadport 100, 100*a*, or 100*b*, the controller 600 transmits a protocol to the external server 20 so that the corresponding FOUP 500, 500*a*, or 500*b* stops performing the getting or putting command.

In specific, the controller 600 determines whether the corresponding FOUP 500, 500*a*, or 500*b* is normally mounted onto the adaptor 110, without any twist, through the angle values in the three directions of the corresponding FOUP 500, 500*a*, or 500*b* sensed by the horizontal sensor 590 and the height values from the adaptor 110 sensed by the height sensors 590, 590*a*, and 590*b*.

If it is determined by the controller 600 that the corresponding FOUP 500, 500*a*, or 500*b* is mounted twistedly onto the adaptor 110 through the angle values and the height values, the controller 600 transmits the alarm protocol to the external server 20 so that the corresponding FOUP 500, 500*a*, or 500*b* stops performing the getting or putting command. Further, the controller 600 transmits the product information of the corresponding FOUP 500, 500*a*, or 500*b* whose height value deviation is over a reference range to the external server 20, thereby preventing the wafer from being transferred to the corresponding FOUP 500, 500*a*, or 500*b*.

Through the operations of the horizontal sensor 590, the height sensors 590, 590*a*, and 590*b*, and the controller 600, the wafer is prevented from being damaged or foreign substances are prevented from being made in a process of allowing the end-effector 213 to get or put the wafer out of or into the corresponding FOUP 500, 500*a*, or 500*b*, thereby ensuring stable wafer processing.

Meanwhile, the RFID tags disposed on the adaptors 110 transmit the product information of the FOUPs 500, 500*a*, and 500*b* mounted on the adaptors 110 to the external server 20. The external server 20 allows the transfer robot driver 220 to operate according to the teaching information corresponding to the product information of the FOUPs 500, 500*a*, and 500*b* received from the RFID tags.

Accordingly, the end-effector 213 moves to the corresponding FOUP 500, 500*a*, or 500*b* to thus transfer the wafer W to the corresponding buffering chamber 310. In this process, the T-axis sensors 540 and 540*a* and the Z-axis sensor 550 transmit the transfer path sensing values of the end-effector 213 and the end-effector arm 213*a* to the controller 600 through the radio communication part 570 in real time.

The controller 600 extracts only the data of the area corresponding to the length d of the end-effector arm 213*a* from the entire transfer path data of the end-effector 213 received from the T-axis sensors 540 and 540*a* and the Z-axis sensor 550 of the corresponding FOUP 500, 500*a*, or 500*b* through the internal communication part 610 and thus produces the extracted data as the transfer path data.

Further, the controller 600 compares the produced transfer path data with the normal transfer path under the teaching information and thus determines whether the end-effector 213 gets or puts the wafer W on the normal transfer path.

Figure 12A:
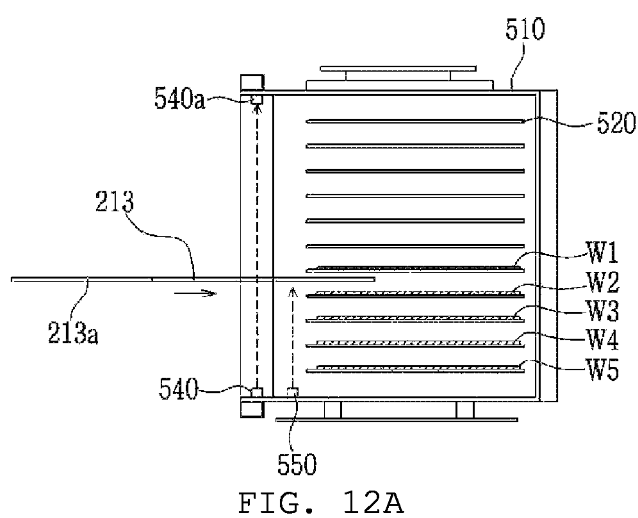
FIGS. 12A, 12B and 12C are exemplary views showing getting operations of the end-effector according to the present invention.
Figure 12B:
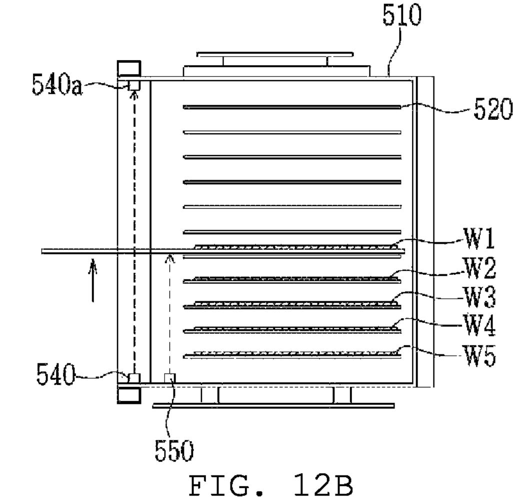
Figure 12C:
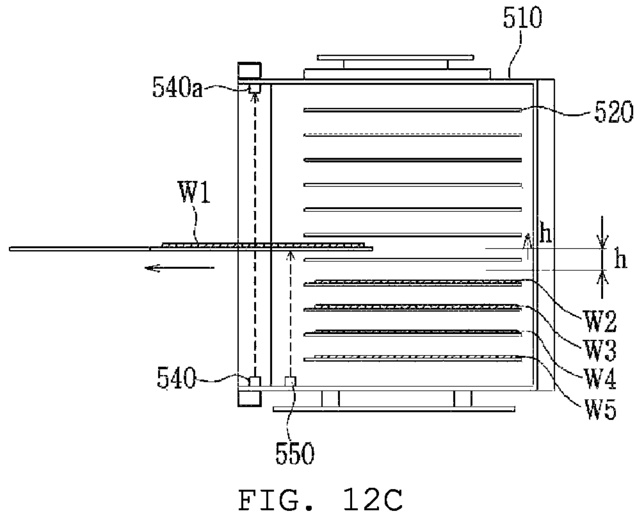

FIGS. 12A to 12C are exemplary views showing a process in which the end-effector 213 gets the wafer W not processed out of the corresponding FOUP 500, 500*a*, or 500*b*. As shown in FIG. 12A, the end-effector 213 is inserted into the corresponding FOUP 500, 500*a*, or 500*b* via the entrance 530.

The end-effector 213 moves along the teaching path received from the external server 20, gets the wafers W in order from the uppermost wafer W among the wafers mounted on the wafer mounting rails 520, and transfers the wafers W to the corresponding buffering chamber 310.

In this case, the light-emitting sensor 540 irradiates light, and the light-receiving sensor 540*a* receives the light, so that they transmit the transfer path data of the end-effector 213 to the controller 600 in real time.

The end-effector 213 enters a space between the wafer mounting rails 520 on which the uppermost wafer W1 is mounted and the wafer mounting rails 520 on which the next uppermost wafer W2 is mounted, and as shown in FIG. 12B, the end-effector 213 moves upward by a given height h and mounts the wafer W1 on top thereof. Next, as shown in FIG. 12C, the end-effector 213 on which the wafer W1 is mounted moves to the outside from the corresponding FOUP 500, 500*a*, or 500*b*.

Figure 13A:
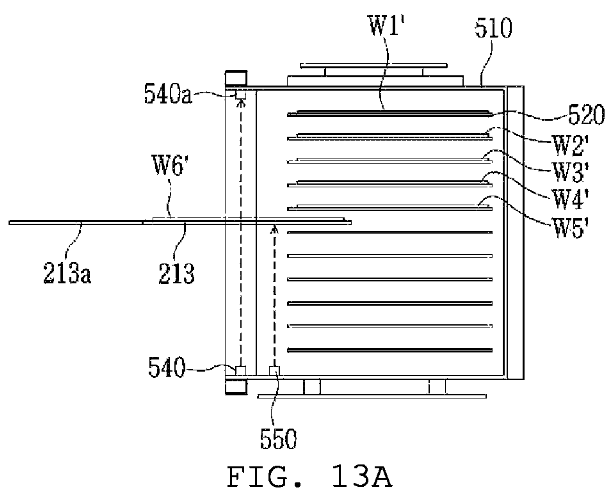
FIGS. 13A, 13B and 13C are exemplary views showing putting operations of the end-effector according to the present invention.
Figure 13B:
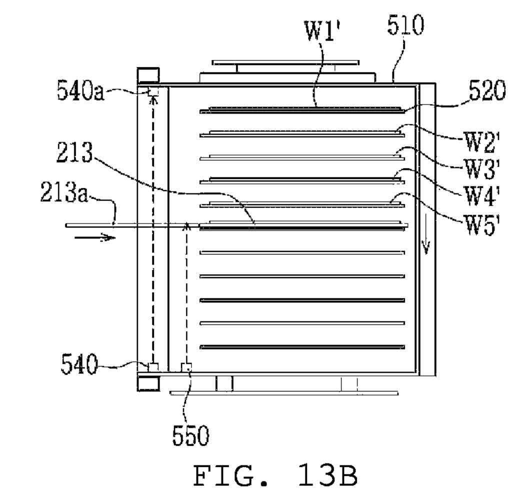
Figure 13C:
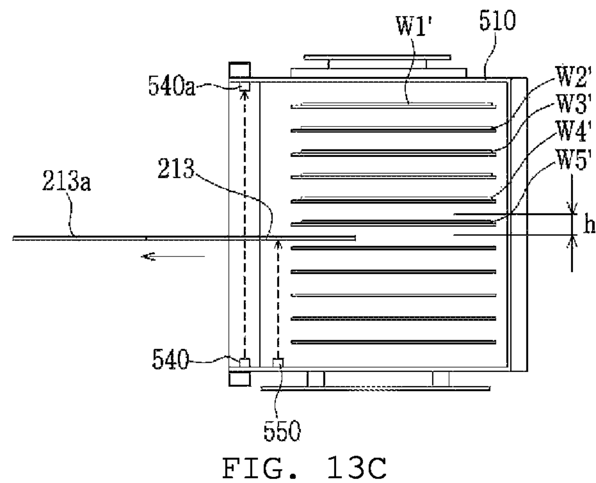

FIGS. 13A to 13C are exemplary views showing a process in which the end-effector 213 puts the wafer W finished in processing into the corresponding FOUP 500, 500*a*, or 500*b*. As shown in FIG. 13A, the end-effector 213, which unloads the wafer W6' finished in processing in the buffering chamber 310, is inserted into the corresponding FOUP 500, 500*a*, or 500*b*. The wafer W6' finished in processing is mounted under the wafer W5' finished in processing that has been pre-mounted onto the corresponding FOUP 500, 500*a*, or 500*b*.

To do this, the end-effector 213 is inserted under the wafer mounting rails 520 on which the wafer W5' finished in processing is mounted, and as shown in FIG. 13B, the end-effector 213 moves downward by a given height h and mounts the wafer W6' finished in processing on the wafer mounting rails 520.

Further, as shown in FIG. 13C, the end-effector 213 moves to the outside from the corresponding FOUP 500, 500*a*, or 500*b*.

Upon the getting or putting operation of the end-effector 213, the Z-axis sensor 550 and the T-axis sensors 540 and 540*a* transmit the entire transfer path data of the end-effector arm 213*a* to the controller 600 through the radio communication part 570.

Figure 14A:
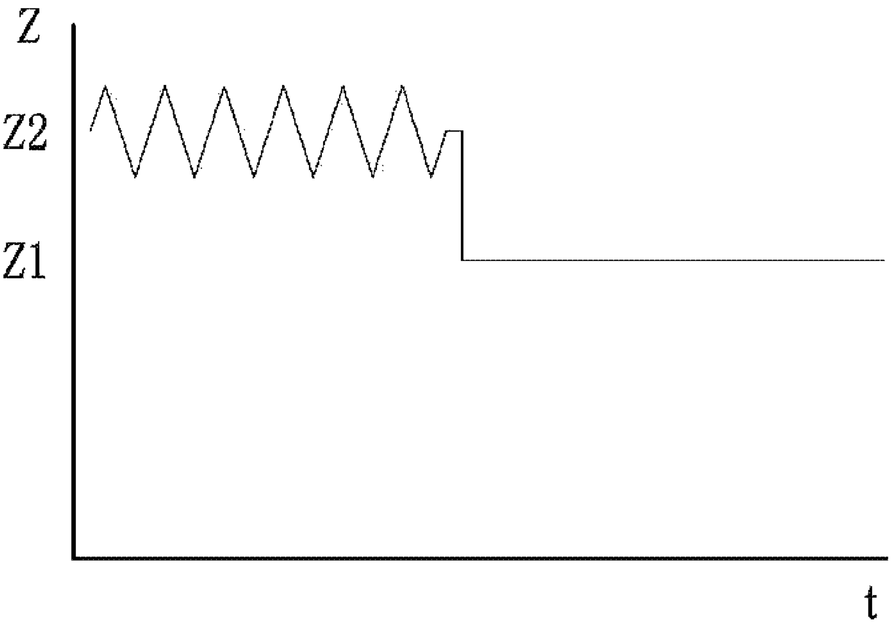
FIGS. 14A and 14B are exemplary views showing the sensed values of a Z-axis sensor of the FOUP upon getting and putting operations.

FIG. 14A is an exemplary view showing the Z-axis values transmitted to the controller 600 from the Z-axis sensor 550 upon the putting operation. In a state where the Z-axis sensor 550 is set to allow the voltage value to become high when the height between the corresponding FOUP and the adaptor is high, as shown, if the end-effector 213 enters the interior of the corresponding FOUP 500, 500*a*, or 500*b* in a state of locating the wafer W finished in processing thereon, the light emitted from the Z-axis sensor 550 is diffusedly reflected onto the wafer W, so that a height value 22 is irregularly received. Next, if the wafer W is mounted on the wafer mounting rails 520, a height value Z1 lower by the given height h than the entry height Z2 is received.

Figure 14B:
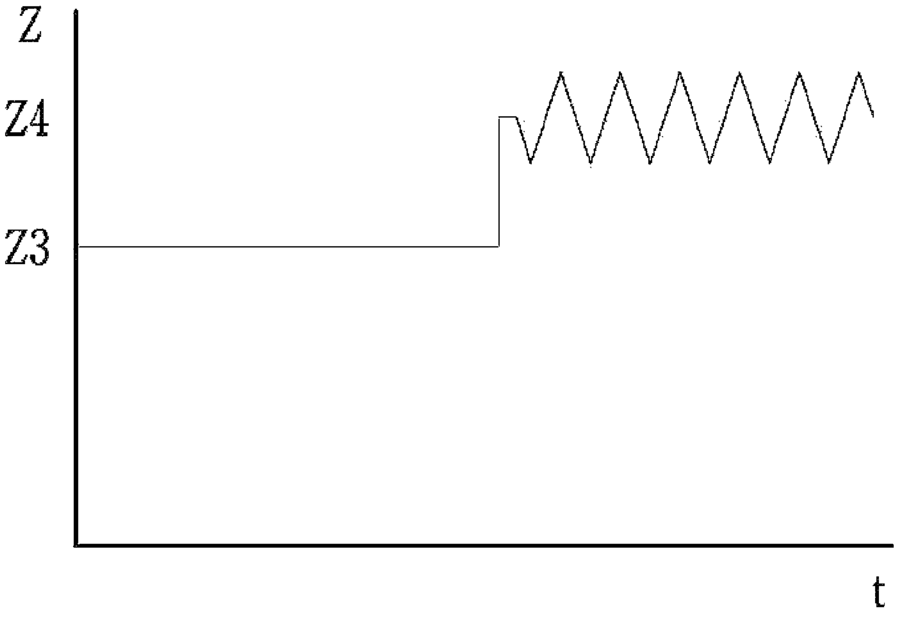

FIG. 14B is an exemplary view showing the Z-axis values transmitted to the controller 600 from the Z-axis sensor 550 upon the getting operation. As shown, because the end-effector 213 enters the interior of the corresponding FOUP 500, 500*a*, or 500*b* in a state of having no wafer W thereon, a constant height value as a third height 23 is received initially, and if the wafer W is mounted on the end-effector 213, next, light is diffusedly reflected on the wafer W so that a fourth height value Z4 higher by the given height h than the third height 23 is received irregularly.

The controller 600 determines whether the putting and getting operations are normally performed based on the transfer path data of the end-effector arm 213*a* that are received from the T-axis sensors 540 and 540*a* and the Z-axis sensor 550.

Further, the controller 600 transmits the integration management data in which the transfer path data of the end-effector arm 213*a* received from the T-axis sensors 540 and 540*a* and the Z-axis sensor 550 and the current operation data of the device received from the sensor part 620 are included to the external server 20.

FIG. 15 is an exemplary view showing the integration management data. The integration management data include header and device numbers, loadport numbers, FOUP types, getting and putting operations, transfer path data (T-axis values and Z-axis values), operation data (pressure, temperature, concentration, and the like), the pressures, temperatures, and concentrations sensed by the sensors, the height values sensed by the height sensors 590, 590, and 590*b*, and the angle values sensed by the horizontal sensor 580, and the like.

The device numbers and the loadport numbers are identification numbers assigned to the respective wafer processing devices 10.

The external server 20 is connected to various types of wafer processing devices 10 on the internet, receives the integration management data from the controllers 600 of the respective wafer processing devices 10, and totally recognizes the current wafer processing situations of the respective wafer processing devices 10.

As the integration management data are transmitted from the controllers 600 to the external server 20, therefore, the respective data of the current wafer processing situations are not transmitted one by one to the external server 20, thereby advantageously reducing the time required for the management of the respective wafer processing devices 10.

In this process, if the current transfer path of the end-effector arm 213*a* that is received from the T-axis sensors 540 and 540*a* and the Z-axis sensor 550 is different from the normal transfer path, the controller 600 transmits an abnormal signal to the external server 20, so that a manager of the external server 20 immediately recognizes the abnormal state.

As a result, wafer damages, which are caused by the abnormal transfer of the end-effector 213, are prevented or minimized.

As described above, the position determination apparatus for the robot detection laser sensor system in the FOUPs is configured to have the plurality of height sensors and horizontal sensors mounted inside the FOUPs to sense heights from the adaptors of the loadports, so that it can determine whether the FOUPs are mounted twistedly on the adaptors. Accordingly, the wafer can be prevented from being transferred through the end-effector to the FOUP that is mounted twistedly on the corresponding adaptor, thereby in advance avoiding the damage thereof.

Further, the position determination apparatus for the robot detection laser sensor system in the FOUPs is configured to have the sensors built in the FOUPs to sense the transfer path of the end-effector, so that it is it is easier to perform construction or maintenance when compared with the conventional practice in which the sensors are disposed on the FOUP entrances of the stage. Further, the FOUPs are separable so that even when the sensors are installed or repaired, advantageously, there is no need to stop the operation of the wafer processing device.

In addition, the sensors serve to sense normal transfer, shift, bending, and transfer height of the end-effector and thus determine whether the end-effector performs the getting or putting operation normally.

Further, the controller performs the communication with the sensors built in the FOUPs to receive the transfer path data of the end-effector and performs the communication with various sensors disposed inside the device to receive the current operation data of the device. Next, the controller transmits the integration management data in which the received transfer path data and the received current operation data of the device are included to the external server, so that the external server determines the current situation of the wafer processing device accurately and quickly.

If there is a difference between the getting and putting operations and the normal operation, the controller transmits the abnormal signal to the external server, so that when the end-effector is abnormally transferred, the manager of the external server can handle the abnormal transfer of the end-effector.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A position determination apparatus for a robot detection laser sensor system in front-opening unified pods (FOUPs), comprising:

an external server; and a wafer processing device for performing processing for wafers and transmitting integration management data to the external server, wherein the wafer processing device comprises:

the FOUPs configured to accommodate the wafers therein;

loadports to which the FOUPs are detachably coupled;

processing chambers in which the processing for the wafers are performed;

an equipment front end module (EFEM) disposed between the processing chambers and the loadports and having an end-effector adapted to get the wafers out of the FOUPs into the processing chambers or put the wafers finished in processing in the processing chambers into the FOUPs; and a controller configured to transmit, if the FOUPs are seated onto the loadports, the transfer path data of the end-effector to the external server when the end-effector moves forward or backward toward and from the FOUPs, wherein each FOUP comprises:

a housing having an entrance toward and from which the end-effector is configured to move forward and backward;

wafer mounting rails disposed spaced apart from one another by a given distance on both side inner walls of the housing in a height direction thereof to mount the wafers sequentially thereonto;

T-axis sensors disposed on top and bottom of the entrance to sense a horizontal transfer path of the end-effector;

a Z-axis sensor disposed on an inner bottom surface of the entrance to sense a vertical transfer height of the end-effector;

a loadport mounting plate disposed on an underside of the housing and electrically coupled to the corresponding loadport;

a sensor support plate mounted on lowermost wafer mounting rails and having a plurality of height sensors disposed on top thereof to sense a height of the corresponding FOUP from the corresponding loadport;

a horizontal sensor disposed on a surface of the sensor support plate to sense whether the housing is located horizontally on level; and a radio communication part disposed inside the housing to transmit sensed values of the T-axis sensors and the Z-axis sensor, angle values sensed by the horizontal sensor, and height values sensed by the plurality of height sensors to the controller.

2. The position determination apparatus according to claim 1, wherein each loadport comprises:

an adaptor on which the loadport mounting plate is located; and a plurality of position fixing pins protruding from a top of the adaptor to fix a mounted position of the loadport mounting plate onto the adaptor thereto when the corresponding FOUP is coupled to the adaptor, the loadport mounting plate having a plurality of lower through holes formed spaced apart from the position fixing pins by a given distance thereon, the housing having a plurality of upper through holes formed on the bottom thereof in positions coaxially with the lower through holes, the sensor support plate having a plurality of height sensing through holes formed on the surface thereof in positions corresponding to the plurality of upper through holes, and the height sensors being disposed spaced apart from tops of the height sensing through holes by a given height by means of sensor fixing brackets mounted on the sensor support plate to sense a height between the corresponding FOUP and the adaptor through the height sensing through holes, the upper through holes, and the lower through holes.

3. The position determination apparatus according to claim 2, wherein the horizontal sensor is configured to sense the angle values of X, Y, and Z-axes.

* * * * *